(12) United States Patent
Huang

(10) Patent No.: US 11,362,870 B2
(45) Date of Patent: Jun. 14, 2022

(54) FREQUENCY MODULATION DEMODULATION DEVICE AND CONTROL METHOD OF FREQUENCY MODULATION DEMODULATION DEVICE

(71) Applicant: RichWave Technology Corp., Taipei (TW)

(72) Inventor: Ching Shou Huang, Taipei (TW)

(73) Assignee: RichWave Technology Corp., Taipei (TW)

( * ) Notice: Subject to any disclaimer, the term of this patent is extended or adjusted under 35 U.S.C. 154(b) by 9 days.

(21) Appl. No.: 17/115,805

(22) Filed: Dec. 9, 2020

(65) Prior Publication Data
US 2022/0006676 A1 Jan. 6, 2022

(30) Foreign Application Priority Data
Jul. 3, 2020 (TW) ................................. 109122531

(51) Int. Cl.
*H04L 27/152* (2006.01)
*H03L 7/099* (2006.01)
(Continued)

(52) U.S. Cl.
CPC ............ *H04L 27/152* (2013.01); *H03L 7/099* (2013.01); *H04L 7/0331* (2013.01); *H03L 7/093* (2013.01)

(58) Field of Classification Search
None
See application file for complete search history.

(56) References Cited

U.S. PATENT DOCUMENTS 4,203,134 A * 5/1980 Christopher ........... H04N 9/882
4,591,805 A * 5/1986 Highton .................... H03G 5/16
330/109
(Continued)

FOREIGN PATENT DOCUMENTS

CN 101989885 A * 3/2011
CN 105939161 A * 9/2016 ............. H03L 7/085
(Continued)

OTHER PUBLICATIONS

H. M. Kwon and Poh Chun Lai, "Frequency offset compensator for land mobile zero-crossing digital FM receiver," Proceedings of MILCOM '96 IEEE Military Communications Conference, 1996, pp. 745-749 vol. 3, doi: 10.1109/MILCOM.1996.571348. (Year: 1996).*

(Continued)

*Primary Examiner* — Berhanu Tadese
(74) *Attorney, Agent, or Firm* — JCIPRNET

(57) ABSTRACT

A frequency modulation demodulation device and a control method thereof are provided. The frequency modulation demodulation device includes an input terminal, a phase converter, a phase-locked loop circuit, and a frequency offset/shift detector. The phase converter receives an input signal to obtain a phase signal. The phase-locked loop circuit generates a phase adjustment signal according to the phase signal and adjusts the phase signal according to the phase adjustment signal to perform demodulation of the input signal. The phase-locked loop circuit performs signal alignment and signal compensation on the phase signal to generate a filtered phase signal. The phase adjustment signal provides a feedback of and adjusts the phase signal. The frequency offset/shift detector generates a frequency offset/shift determining signal according to the phase adjustment (Continued)

signal. The frequency offset/shift determining signal is related to a phase frequency offset/shift of the input signal.

16 Claims, 9 Drawing Sheets

(51) Int. Cl.
    *H04L 7/033*     (2006.01)
    *H03L 7/093*     (2006.01)

(56) References Cited

U.S. PATENT DOCUMENTS

| | | | | |
|---|---|---|---|---|
| 4,837,853 A * | 6/1989 | Heck | H03D 3/242 | 455/208 |
| 5,111,346 A * | 5/1992 | Matsuoka | G11B 20/02 | |
| 5,140,278 A * | 8/1992 | Kirkham | H03L 7/091 | 331/25 |
| 5,450,033 A * | 9/1995 | Hirabayashi | H03D 3/005 | 327/39 |
| 5,633,895 A * | 5/1997 | Powell, II | H04L 27/1563 | 375/336 |
| 6,233,347 B1 * | 5/2001 | Chen | H04H 20/31 | 382/100 |
| 6,265,948 B1 * | 7/2001 | Stevenson | H04L 27/12 | 375/272 |
| 6,288,618 B1 * | 9/2001 | Stevenson | H04L 27/12 | 375/334 |
| 6,674,812 B1 * | 1/2004 | Stevenson | H04L 27/2334 | 375/302 |
| 7,368,956 B2 * | 5/2008 | Chiu | H03K 5/003 | 327/60 |
| 8,509,717 B2 * | 8/2013 | Shiu | H04B 1/1653 | 455/161.1 |
| 9,432,231 B1 * | 8/2016 | Fu | H04L 27/148 | |
| 9,692,464 B1 * | 6/2017 | Cheng | H04B 1/0475 | |
| 9,813,268 B2 * | 11/2017 | Fu | H04L 27/122 | |
| 10,491,261 B1 * | 11/2019 | Al-Eidan | H04B 17/336 | |
| 2001/0043657 A1 * | 11/2001 | Yamauchi | H04L 7/042 | 329/311 |
| 2004/0009759 A1 * | 1/2004 | Mayor | H04B 1/7156 | 455/313 |
| 2005/0169401 A1 * | 8/2005 | Abraham | H04L 1/0003 | 375/295 |
| 2005/0232385 A1 * | 10/2005 | Yoshikawa | H03C 3/095 | 375/376 |
| 2006/0199622 A1 * | 9/2006 | Bhanji | H04B 1/40 | 455/575.1 |
| 2007/0189044 A1 * | 8/2007 | Liu | H02M 5/4585 | 363/34 |
| 2008/0100510 A1 * | 5/2008 | Bonthron | G01S 13/89 | 342/373 |
| 2009/0175385 A1 * | 7/2009 | Tsai | H04H 40/18 | 375/326 |
| 2010/0225387 A1 * | 9/2010 | Pettigrew | H03D 3/007 | 329/315 |
| 2010/0285764 A1 * | 11/2010 | Shiu | H04B 1/1653 | 455/208 |
| 2010/0303111 A1 * | 12/2010 | Kupershmidt | H01S 5/14 | 372/32 |
| 2010/0330941 A1 * | 12/2010 | Trikha | H04H 40/45 | 455/180.1 |
| 2011/0110459 A1 * | 5/2011 | Abraham | H04L 1/0003 | 375/295 |
| 2011/0129036 A1 * | 6/2011 | Okuhata | H04L 27/1525 | 375/316 |
| 2012/0028594 A1 * | 2/2012 | Rao | H03D 3/009 | 455/207 |
| 2012/0154031 A1 * | 6/2012 | Zuckerman | H03L 7/185 | 327/551 |
| 2013/0343547 A1 * | 12/2013 | Pahuja | H04H 40/36 | 381/2 |
| 2016/0261442 A1 * | 9/2016 | Fu | H04L 27/122 | |
| 2016/0337151 A1 * | 11/2016 | Fu | H04L 27/148 | |
| 2020/0295768 A1 * | 9/2020 | Rasmussen | H03L 1/02 | |
| 2022/0006676 A1 * | 1/2022 | Huang | H03D 3/04 | |

FOREIGN PATENT DOCUMENTS

| | | | | |
|---|---|---|---|---|
| EP | 574273 A1 * | 12/1993 | | H03D 3/007 |
| EP | 1022847 A2 * | 7/2020 | | H03D 3/006 |
| EP | 3719534 A1 * | 10/2020 | | G01S 13/04 |
| TW | 201639334 A * | 11/2016 | | |

OTHER PUBLICATIONS

T. Yalcin and N. Ismailoglu, "A low-power system-on-chip for telecommunications: single chip digital FM receiver/demodulator IP," Conference Record of the Thirty-Third Asilomar Conference on Signals, Systems, and Computers (Cat. No. CH37020), 1999, pp. 780-783 vol. 1, doi: 10.1109/ACSSC.1999.832435. (Year: 1999).*
Yalcin et al. Single Chip Digital FM Receiver-Demodulator utilizing the zero-cross detection technique, IEEE 1999.*
Office Action of Taiwan Counterpart Application, dated Feb. 17, 2021, pp. 1-20.

* cited by examiner

FREQUENCY MODULATION DEMODULATION DEVICE AND CONTROL METHOD OF FREQUENCY MODULATION DEMODULATION DEVICE

CROSS-REFERENCE TO RELATED APPLICATION

This application claims the priority benefit of Taiwan application serial no. 109122531, filed on Jul. 3, 2020. The entirety of the above-mentioned patent application is hereby incorporated by reference herein and made a part of this specification.

BACKGROUND

Technical Field

The disclosure relates to a technique for performing audio demodulation at a receiving terminal in a frequency modulation (FM) broadcast, and in particular, to an FM demodulation device and a control method of the FM demodulation device.

Description of Related Art

A frequency modulation broadcast (often abbreviated as an FM broadcast) is a radio broadcasting technology which transmits audio based on the frequency modulation technique. FIG. 1 is a schematic block diagram of an audio receiving apparatus 100 for the FM broadcast. Referring to FIG. 1, a receiving terminal IN1 of the audio receiving apparatus 100 obtains data 105 for carrying audio, and the audio receiving apparatus 100 uses a phase converter 110 and a frequency domain converter 120 to perform demodulation on the data 105, thereby obtaining audio content (for example, demodulated output data 125) in the data.

However, when the energy contained in the data 105 or the signal quality of the data is low due to long-distance communication, it is difficult for the audio receiving apparatus 100 to detect frequency and phase changes in the data 105. In this way, it is difficult to correctly demodulate the audio in the data 105, so that the audio receiving apparatus 100 has low sensitivity to the data 105. In other words, when the sensitivity of the audio receiving apparatus 100 to the data 105 is low, the quality of the demodulated audio in the demodulated output data 125 is also low. Therefore, how to enable the audio receiving apparatus 100 to have higher sensitivity to the data 105 to obtain good audio quality is one of the research directions to work on.

SUMMARY

The invention provides a frequency modulation (FM) demodulation device and a control method of the FM demodulation device, so that good audio quality could still be obtained from received data in a case of small energy or poor signal quality contained in the received data, thereby improving sensitivity of the FM demodulation device to the received data.

The FM demodulation device of the invention includes an input terminal, a phase converter, a phase-locked loop (PLL) circuit, and a frequency offset/shift detector. The input terminal receives an input signal. The phase converter is coupled to the input terminal and receives the input signal to obtain a phase signal. The phase-locked loop circuit is coupled to the phase converter to generate a phase adjustment signal according to the phase signal, and the phase-locked loop circuit adjusts the phase signal according to the phase adjustment signal, to perform demodulation of the input signal. The frequency offset/shift detector is coupled to the phase-locked loop circuit and generates a frequency offset/shift determining signal according to the phase adjustment signal obtained from the phase-locked loop circuit. The frequency offset/shift determining signal is related to a phase frequency offset/shift of the input signal.

The control method of the FM demodulation device of the invention includes the following steps: receiving an input signal; obtaining a phase signal according to the input signal by using a phase converter; generating a phase adjustment signal according to the phase signal by using a PLL circuit, where the PLL circuit is configured to adjust the phase signal according to the phase adjustment signal, to perform demodulation of the input signal; and generating a frequency offset/shift determining signal according to the phase adjustment signal, where the frequency offset/shift determining signal is related to a phase frequency offset/shift of the input signal.

Based on the foregoing, according to the FM demodulation device and the control method thereof in the embodiments of the invention, signal alignment and signal compensation are performed, by using the PLL circuit, on the signal (that is, the phase signal) processed by the phase converter, so that the FM demodulation device still has high sensitivity to the audio in the received data in a case of low energy or poor signal quality contained in the received data. In addition, the FM demodulation device of the present embodiment further uses the frequency offset/shift detector to determine a frequency offset/shift status of the current phase signal from the signal (that is, the phase adjustment signal) processed by the PLL circuit, thereby generating the frequency offset/shift determining signal. Accordingly, when the FM demodulation device learns based on the frequency offset/shift determining signal that the frequency offset/shift of the input signal is excessively large, the FM demodulation device may automatically adjust the receiving frequency band of the input signal to reduce the frequency offset/shift, or automatically reduce a volume of the audio signal, so that good audio quality is obtained.

DESCRIPTION OF THE EMBODIMENTS

Figure 1:
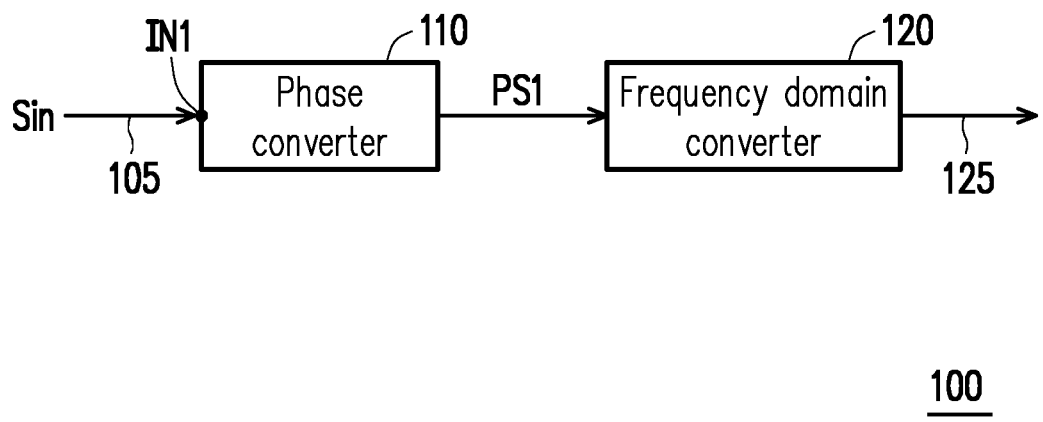
FIG. 1 is a schematic block diagram of an audio receiving apparatus for an FM broadcast.
Figure 2:
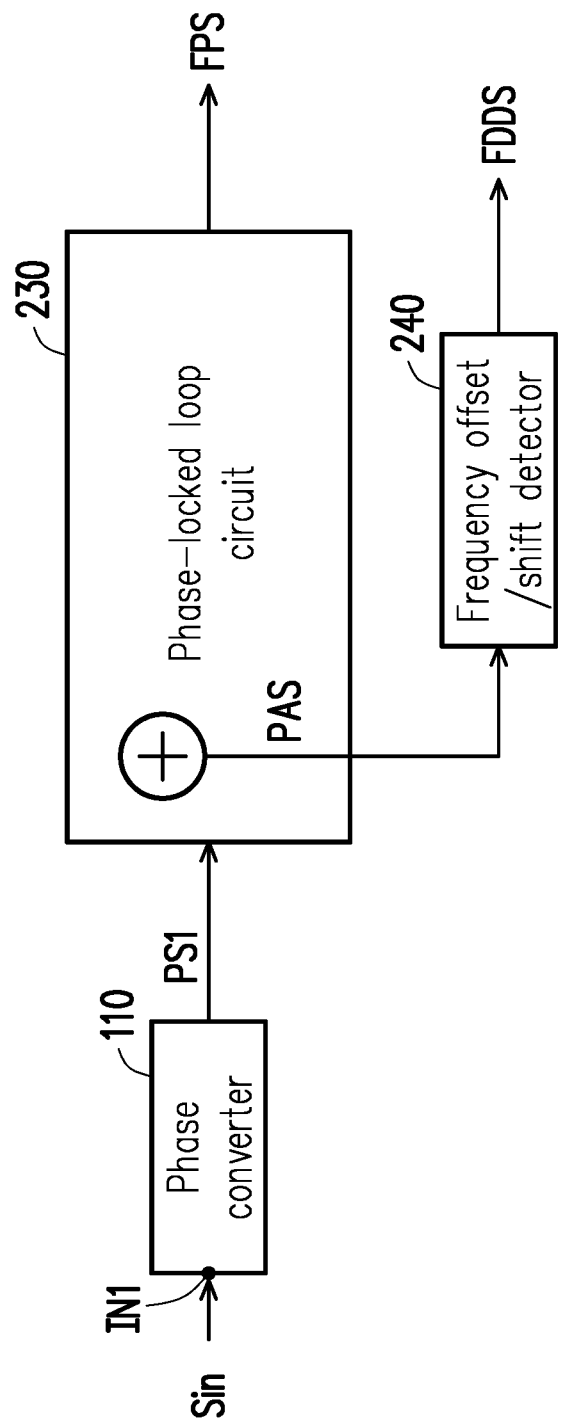
FIG. 2 is a schematic block diagram of an FM demodulation device according to an embodiment of the invention.

FIG. 2 is a schematic block diagram of an FM demodulation device 200 according to an embodiment of the invention. The FM demodulation device 200 may be a part of an audio receiving apparatus of an FM broadcast. In other embodiments, the FM demodulation device 200 of FIG. 2 may further be applied to a frequency shift keying (FSK) signal receiving apparatus for wireless transmission.

The FM demodulation device 200 includes an input terminal IN1, a phase converter 110, a PLL circuit 230, and a frequency offset/shift detector 240. The input terminal IN1 of the FM demodulation device 200 receives an input signal Sin including audio. In the present embodiment, the input signal Sin may be in-phase/quadrature data (often referred to as I/Q data) that shows changes in strength and a phase of a sine wave.

The phase converter 110 is coupled to the input terminal IN1. The phase converter 110 receives the input signal Sin to obtain a phase signal PS1. In detail, the phase converter 110 determines a phase of the input signal Sin by using a frequency of the input signal Sin, thereby generating the phase signal PS1.

The PLL circuit 230 is coupled to the phase converter 110. The PLL circuit 230 generates a phase adjustment signal PAS according to the phase signal PS1. The PLL circuit 230 adjusts the phase signal PS1 according to the phase adjustment signal PAS to perform demodulation of the input signal Sin, thereby generating a filtered phase signal FPS. In other words, the PLL circuit 230 performs signal alignment and signal compensation on the phase signal PS1 processed by the phase converter 110 to generate the filtered phase signal FPS. Therefore, by performing the signal alignment and signal compensation on the phase signal PS1 to generate an adjusted phase signal (see FIG. 3 and related descriptions below), the filtered phase signal FPS, and the phase adjustment signal PAS, the PLL circuit 230 could still have high sensitivity to audio in the input signal Sin in a case of low energy (or referred to as a carrier amplitude in the input signal Sin) contained in the input signal Sin or poor signal quality thereof.

In the embodiment of FIG. 2, the filtered phase signal FPS may be used as an output signal of the FM demodulation device 200. In other embodiments, a person applying the present embodiment may choose one of the adjusted phase signal (see FIG. 3 and related description below), the filtered phase signal FPS, and the phase adjustment signal PAS in the PLL circuit 230 according to needs as an output signal of the FM demodulation device 200, so that a back-end audio processing apparatus could obtain an audio signal in one of the selected signals.

A frequency offset/shift detector 240 of FIG. 2 is coupled to the PLL circuit 230. The frequency offset/shift detector 240 generates a frequency offset/shift determining signal FDDS according to the phase adjustment signal PAS obtained from the PLL circuit 230. The frequency offset/shift determining signal FDDS is related to phase frequency offset/shift of the input signal Sin. In other words, the frequency offset/shift detector 240 of the present embodiment detects a phase frequency offset/shift degree of the input signal Sin by using the phase adjustment signal PAS obtained from the PLL circuit 230.

Figure 3:
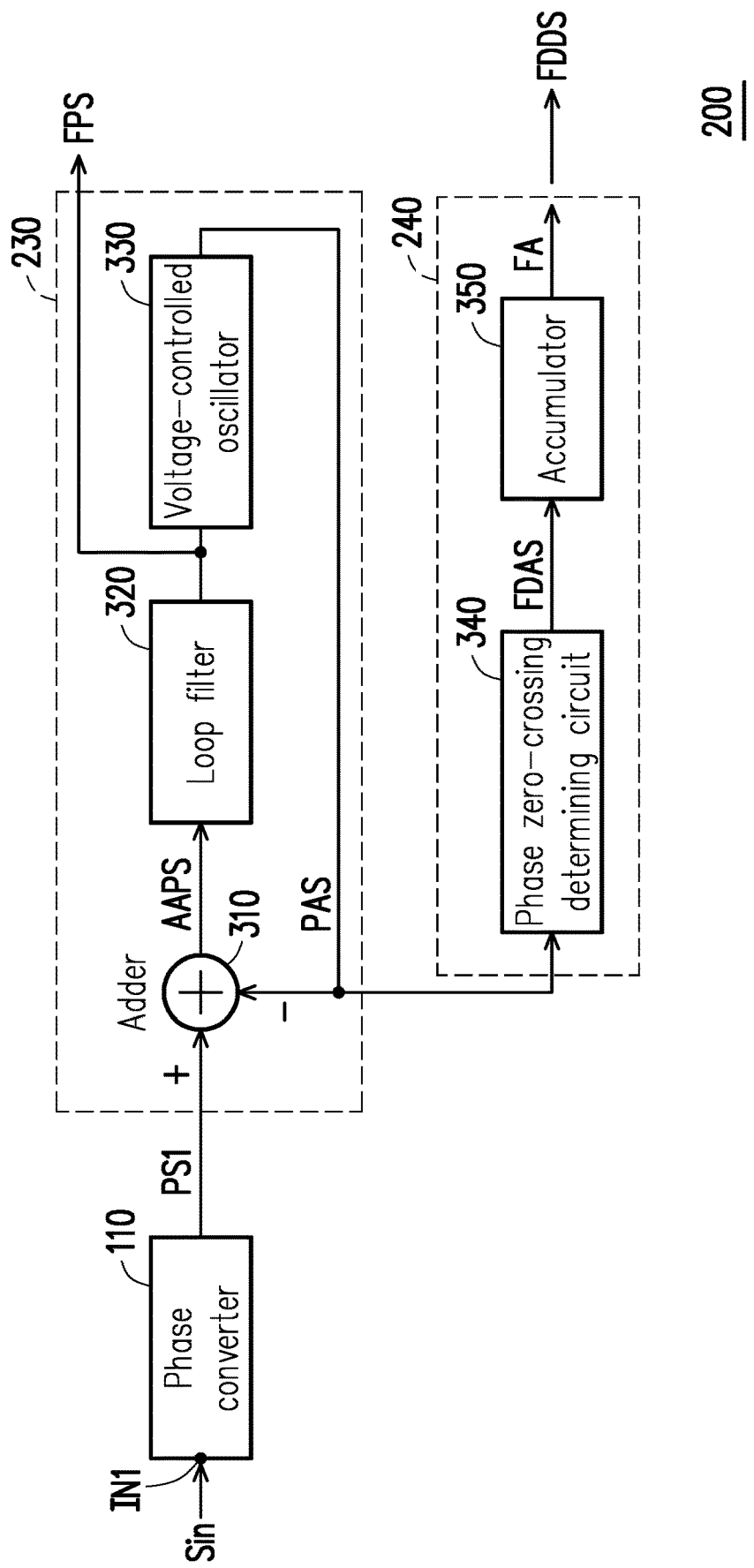
FIG. 3 is a schematic detailed block diagram of an FM demodulation device according to an embodiment of the invention.

FIG. 3 is a schematic detailed block diagram of an FM demodulation device 200 according to an embodiment of the invention. FIG. 3 mainly illustrates a detailed circuit structure of the PLL circuit 230 and the frequency offset/shift detector 240 in FIG. 2. The PLL circuit 230 in FIG. 3 includes an adder 310, a loop filter 320, and a voltage-controlled oscillator (VCO) 330. The adder 310 receives a phase signal PS1 from a phase converter 110 and adds up the phase signal PS1 and a phase adjustment signal PAS to generate an adjusted phase signal AAPS. The loop filter 320 is coupled to the adder 310. The loop filter 320 receives and filters an adjusted phase signal AAPS to generate a filtered phase signal FPS. In the present embodiment, the loop filter 320 may be a low-pass filter. The voltage-controlled oscillator 330 is coupled to the loop filter 320. The voltage-controlled oscillator 330 generates the phase adjustment signal PAS according to the filtered phase signal FPS. In the present embodiment, the phase adjustment signal PAS which is generated by the voltage-controlled oscillator 330 and the adder 310 serve as a feedback loop to provide a feedback of and adjust the phase signal PS1.

Still referring to FIG. 3, the frequency offset/shift detector 240 includes a phase zero-crossing determining circuit 340 and an accumulator 350. The phase zero-crossing determining circuit 340 receives the phase adjustment signal PAS and determines an adjustment direction of the phase adjustment signal PAS with respect to the phase signal PS1 to generate a frequency offset/shift detection signal FDAS. The accumulator 350 is coupled to the phase zero-crossing determining circuit 340. The accumulator 350 accumulates the frequency offset/shift detection signal FDAS to generate a frequency offset/shift accumulation signal FA. The frequency offset/shift accumulation signal FA is related to the frequency offset/shift determining signal FDDS and is used to present a phase frequency offset/shift status of an input signal Sin.

Figure 4:
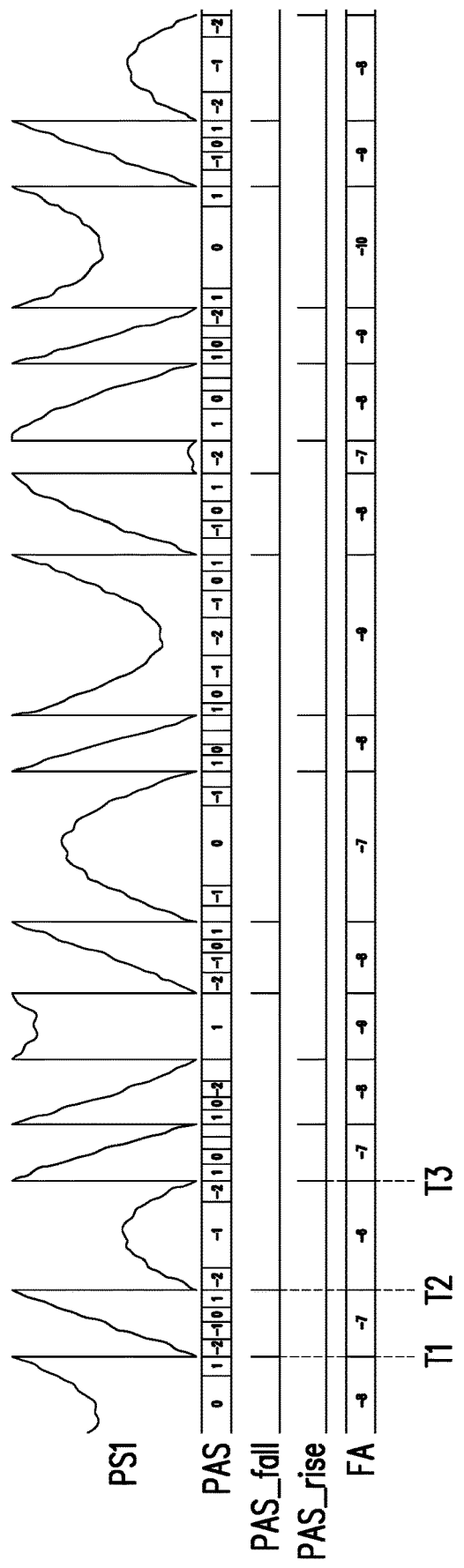
FIG. 4 is a waveform diagram of various input signals without frequency offset/shift in an FM demodulation device according to an embodiment of the invention.

FIG. 4 is a waveform diagram of various input signals Sin without frequency offset/shift in an FM demodulation device 200 according to an embodiment of the invention. FIG. 4 shows a phase signal PS1 presented by 15 bits, a phase adjustment signal PAS presented by 2 bits, a phase fall detection signal PAS_fall with an adjustment direction of the phase adjustment signal PAS as a first adjustment direction, a phase rise detection signal PAS_rise with an adjustment direction of the phase adjustment signal PAS as a second adjustment direction, and a frequency offset/shift accumulation signal FA presented by 17 bits. FIG. 4 shows that waveforms and values of signals of the frequency offset/shift detector 240 in FIG. 4 increase or decrease with each other in a case of no frequency offset/shift for the input signal Sin.

Referring to both FIG. 3 and FIG. 4, assuming that an initial count value presented by the frequency offset/shift accumulation signal FA is "−8". When the phase adjustment signal PAS is changed from a positive value (for example, "1") to a negative value (for example, "−2"), such as time points T1 and T2 in FIG. 4, the phase fall detection signal PAS_fall is enabled. At this time, the phase zero-crossing determining circuit 340 sets the frequency offset/shift detection signal FDAS to a predetermined negative frequency offset/shift value, to indicate that an adjustment direction of the phase adjustment signal PAS is the first adjustment direction (that is, a positive frequency offset/shift direction). In addition, when an accumulator 350 receives the phase signal PAS in the first adjustment direction (a positive frequency offset/shift direction), a count value in the accumulator is increased by 1. For example, at a time point T1, the frequency offset/shift accumulation signal FA is changed from "−8" to "−7"; and at a time point T2, the frequency offset/shift accumulation signal FA is changed from "−7" to "−6".

In addition, when the phase adjustment signal PAS is changed from a negative value (for example, "−2") to a positive value (for example, "1"), such as a time point T3 in FIG. 4, a phase rise detection signal PAS_rise is enabled. At this time, the phase zero-crossing determining circuit 340 sets the frequency offset/shift detection signal FDAS to a predetermined positive frequency offset/shift value, to indicate that the adjustment direction of the phase signal is a second adjustment direction (that is, a negative frequency offset/shift direction). In addition, when the accumulator 350 receives the phase signal PAS in the second adjustment direction (the negative frequency offset/shift direction), the count value in the accumulator is decreased by 1. For example, at a time point T3, the frequency offset/shift accumulation signal FA is changed from "−6" to "−7". The first adjustment direction (positive frequency offset/shift direction) described in the present embodiment is opposite to the second adjustment direction (negative frequency offset/shift direction). Therefore, when the input signal Sin has no frequency offset/shift, the frequency offset/shift accumulation signal FA fluctuates around the value "−8", and the FM demodulation device 200 may generate a frequency offset/shift determining signal FDDS depending on excessive change in the value of the frequency offset/shift accumulation signal FA, to determine an offset/shift status of the input signal Sin. What's more, a person applying the present embodiment may further use a device (such as a controller of FIG. 7 and a sound control device of FIG. 8 described later) that receives the frequency offset/shift accumulation signal FA to determine the frequency offset/shift status of the input signal Sin.

Figure 5:
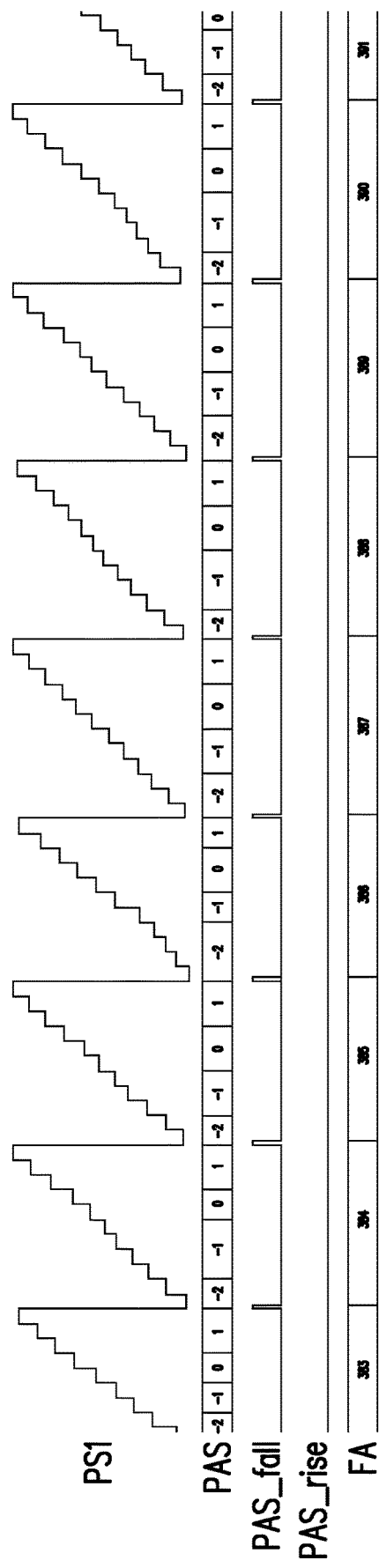
FIG. 5 is a waveform diagram of various input signals with frequency offset of +40 KHz in an FM demodulation device according to an embodiment of the invention.

FIG. 5 is a waveform diagram of various input signals Sin with frequency offset/shift of +40 KHz in an FM demodulation device 200 according to an embodiment of the invention. Referring to both FIG. 3 and FIG. 5, because the input signal Sin has frequency offset/shift of +40 KHz, a value of the phase signal PS1 thus always increases upwards, leading a phase fall detection signal PAS_fall to be continuously enabled. At this time, the phase zero-crossing determining circuit 340 sets the frequency offset/shift detection signal FDAS to a predetermined negative frequency offset/shift value to indicate that an adjustment direction of the phase signal PAS is the first adjustment direction (that is, a positive frequency offset/shift direction). In addition, when an accumulator 350 receives the phase signal PAS in the first adjustment direction (a positive frequency offset/shift direction), a count value in the accumulator is increased by 1. In this way, the value of the frequency offset/shift accumulation signal FA is gradually accumulated from an initial "383" to "391" in FIG. 5.

Figure 6:
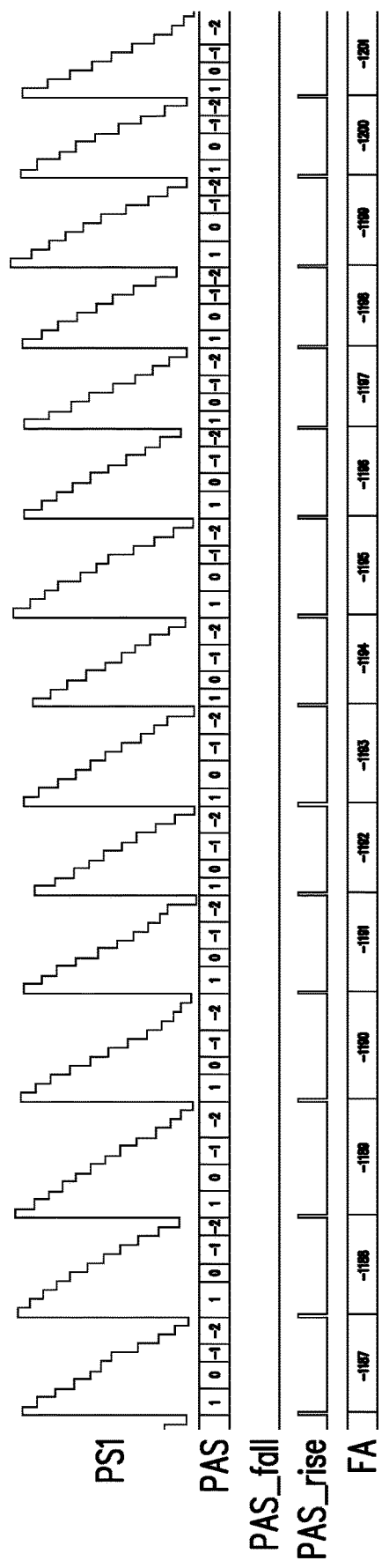
FIG. 6 is a waveform diagram of various input signals with frequency offset of −40 KHz in an FM demodulation device according to an embodiment of the invention.

FIG. 6 is a waveform diagram of various input signals Sin with frequency offset/shift of −40 KHz in an FM demodulation device 200 according to an embodiment of the invention. Referring to both FIG. 3 and FIG. 6, because the input signal Sin has frequency offset/shift of −40 KHz, thus a value of the phase signal PS1 always decreases downwards, leading a phase rise detection signal PAS_rise to be continuously enabled. At this time, the phase zero-crossing determining circuit 340 sets the frequency offset/shift detection signal FDAS to a predetermined positive frequency offset/shift value to indicate that the adjustment direction of the phase signal PAS is a second adjustment direction (that is, a negative frequency offset/shift direction). In addition, when the accumulator 350 receives the phase signal PAS in the second adjustment direction (the negative frequency offset/shift direction), the count value in the accumulator is decreased by 1. In this way, the value of the frequency offset/shift accumulation signal FA is gradually decreased from an initial "−1187" to "−1201" in FIG. 6.

After the description of the phase signal PS1, the phase adjustment signal PAS, and the frequency offset/shift accumulation signal FA related to the frequency offset/shift determining signal FDDS in the foregoing embodiments of FIG. 4 to FIG. 6, it may be known that the frequency offset/shift detector 240 of FIG. 3 could generate a frequency offset/shift determining signal FDDS based on the phase adjustment signal PAS obtained from the PLL circuit 230, thereby detecting a phase frequency offset/shift status of the input signal Sin. The FM demodulation device of the present embodiment of the invention may automatically adjust the input signal Sin or a back-end audio signal by using the frequency offset/shift determining signal FDDS, thereby obtaining good audio quality.

Figure 7:
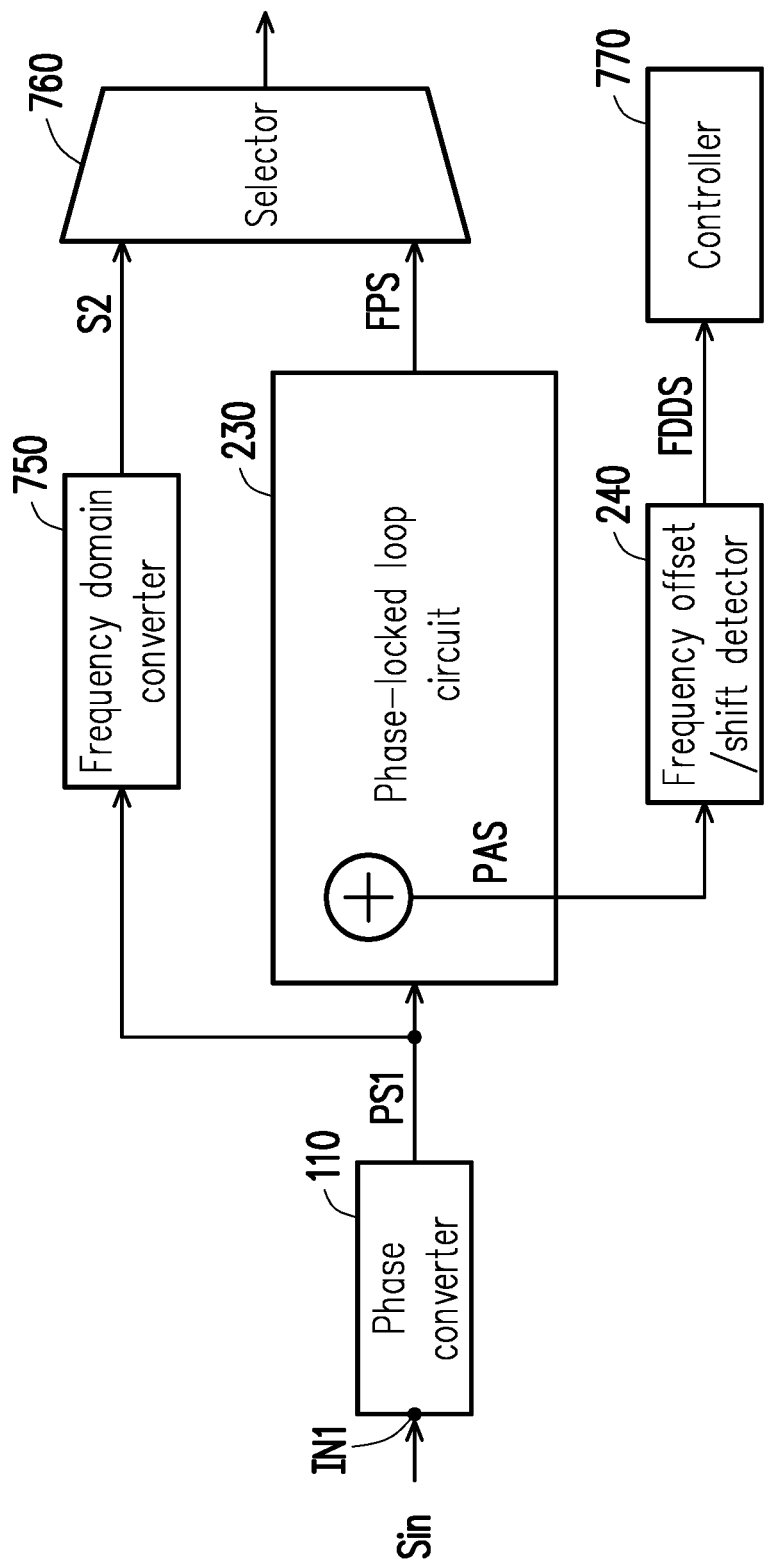
FIG. 7 is a schematic detailed block diagram of an FM demodulation device according to another embodiment of the invention.

FIG. 7 is a schematic detailed block diagram of an FM demodulation device 700 according to another embodiment of the invention. Compared to FIG. 3, the FM demodulation device 700 of FIG. 7 may further include a frequency domain converter 750 and a selector 760. The frequency domain converter 750 is coupled to a phase converter 110. The frequency domain converter 750 generates a demodulated output signal S2 according to a phase signal PS1. The frequency domain converter in the present embodiment may be a discrete frequency domain converter, such as a Z-transformer, which may be presented by an equation $(1-Z)\textasciicircum{}-1$.

The selector 760 is coupled to the frequency domain converter 750 and a PLL circuit 230. A first receiving terminal of the selector 760 receives a demodulated output signal S2 generated by the frequency domain converter 750. A second receiving terminal of the selector 760 receives a filtered phase signal FPS generated by the PLL circuit 230. The selector 760 selectively uses one of the demodulated output signal S2 and the filtered phase signal FPS as an output signal of the FM demodulation device 700 according to an amplitude or signal quality of the input signal Sin. In detail, when the amplitude or the signal quality of the input signal Sin is greater than a predetermined energy value, because the amplitude (that is, energy contained in the input signal Sin) of the input signal Sin is sufficiently great, and the frequency domain converter 750 has a good frequency and phase change recognition degree of the input signal Sin in a case of a sufficiently great amplitude of the input signal Sin or good signal quality, the selector 760 may use the demodulated output signal S2 generated by the frequency domain converter 750 as the output signal of the FM demodulation device 700. On the contrary, when the amplitude or the signal quality of the input signal is less than the predetermined energy value, because the PLL circuit 230 has a good frequency and phase change recognition degree of the input signal Sin in a case that the input signal Sin has a small amplitude (that is, the energy contained in the input signal Sin) or poor signal quality, the selector 760 uses the filtered phase signal FPS generated by the PLL circuit 230 as the output signal of the FM demodulation device 700.

The FM demodulation device 700 may further include a controller 770. The controller 770 is coupled to a frequency offset/shift detector 240. In the present embodiment, the controller 770 may automatically adjust a receiving frequency band of the input signal Sin according to the frequency offset/shift determining signal FDDS, thereby reducing the frequency offset/shift of the input signal Sin.

Figure 8:
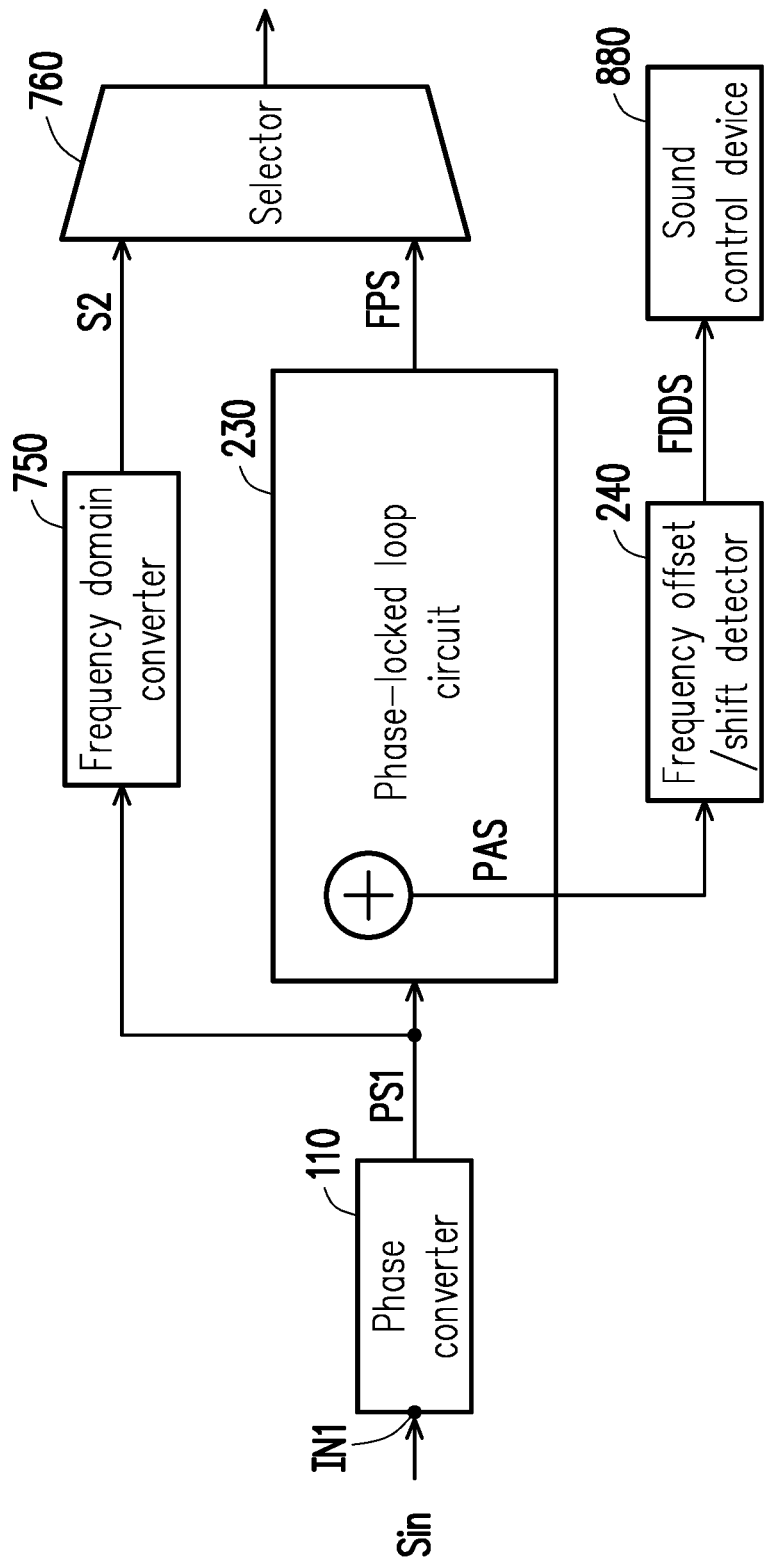
FIG. 8 is a schematic detailed block diagram of an FM demodulation device according to yet another embodiment of the invention.

FIG. 8 is a schematic detailed block diagram of an FM demodulation device 800 according to yet another embodiment of the invention. Compared to FIG. 7, the FM demodulation device 800 of FIG. 8 may further include a sound control device 880. The sound control device 880 is coupled to a frequency offset/shift detector 240. The sound control device 880 of the present embodiment may adjust, according to a frequency offset/shift determining signal FDDS, a magnitude of a sound wave of an audio signal output from a rear end. The audio signal in the present embodiment is related to a demodulated input signal Sin. In other words, when the frequency offset/shift status of the input signal Sin is serious, the audio signal related to the input signal Sin also has many noises or interferences. At this time, in the present embodiment, a magnitude of a sound wave (that is, a volume) of the audio signal is automatically reduced, and the audio signal may be even turned off to prevent being played, preventing a user from hearing an audio signal with poor quality and loud noise in case of a serious frequency offset/shift status of the input signal Sin.

A person applying the present embodiment may combine the controller 770 of FIG. 7 with the sound control device 880 of FIG. 8, so that the FM demodulation device could use the frequency offset/shift determining signal FDDS to know that the frequency offset/shift status of the input signal Sin is more serious, and then a magnitude of the sound wave of the audio signal is automatically reduced or the receiving frequency band of the input signal Sin is automatically adjusted. In addition, the person applying the present embodiment may use the frequency offset/shift determining signal FDDS to make the FM demodulation device have more applications. For example, when it is known that the frequency offset/shift status of the input signal Sin is serious, the user could be notified to change a channel and manually adjust the frequency band of the input signal Sin, etc.

Figure 9:
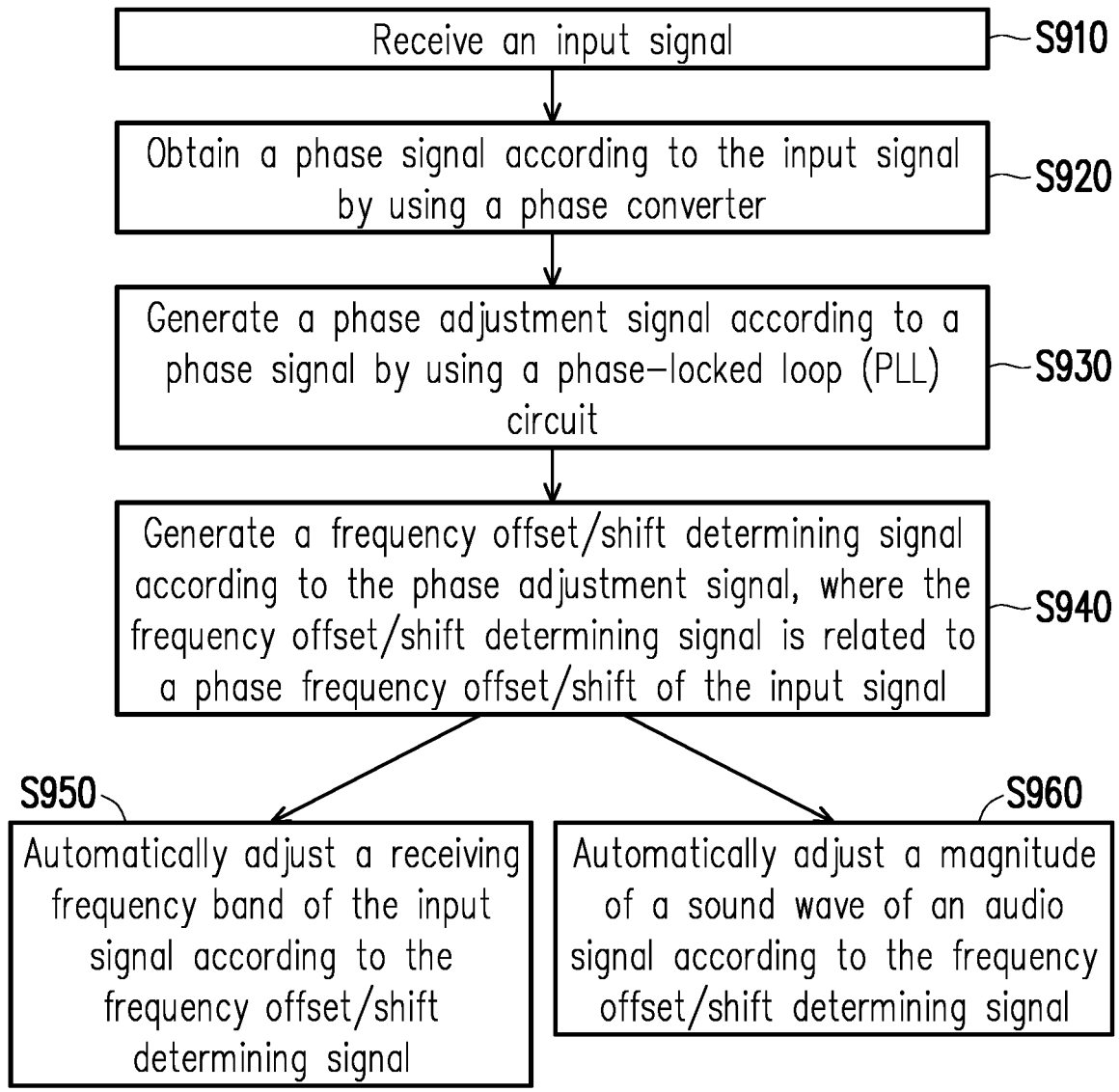
FIG. 9 is a flowchart of a control method of an FM demodulation device according to an embodiment of the invention.

FIG. 9 is a flowchart of a control method of an FM demodulation device according to an embodiment of the invention. The control method described in FIG. 9 may be applied to the FM demodulation devices 200, 700, and 800 of FIG. 3, FIGS. 7, and 8 in the present embodiment. Herein, the FM demodulation device 700 of FIG. 7 is used as an example. Referring to FIG. 7 and FIG. 9, in step S910, a phase converter 110 receives an input signal Sin. In step S920, a phase signal PS1 is obtained according to the input signal Sin by using the phase converter 110. In step S930, a phase adjustment signal PAS is generated according to the phase signal PS1 by using a PLL circuit 230. The PLL circuit 230 adjusts the phase signal PS1 according to the phase adjustment signal PAS to perform demodulation of the input signal Sin, thereby generating a filtered phase signal FPS. In step S940, a frequency offset/shift detector 240 generates a frequency offset/shift determining signal FDDS according to the phase adjustment signal PAS, and the frequency offset/shift determining signal FDDS is related to phase frequency offset/shift of the input signal Sin.

It should be specially noted that step S950 corresponds to the controller 770 in FIG. 7, and step S960 corresponds to the sound control device 880 in FIG. 8. In step S950, the controller 770 in FIG. 7 automatically adjusts a receiving frequency band of the input signal Sin according to the frequency offset/shift determining signal FDDS. In step S960, the sound control device 880 in FIG. 8 automatically adjusts a magnitude of a sound wave of an audio signal according to the frequency offset/shift determining signal FDDS, and the audio signal is related to the demodulated input signal Sin. For relevant embodiments and descriptions of steps in FIG. 9, reference may be made to the foregoing drawings and embodiments.

Based on the foregoing, according to the FM demodulation device and the control method thereof in embodiments of the invention, signal alignment and signal compensation are performed, by using the PLL circuit, on the signal (that is, the phase signal) processed by the phase converter, so that the FM demodulation device still has high sensitivity to audio in the received data in a case of small energy or poor signal quality contained in the received data. In addition, the FM demodulation device of the present embodiment further uses the frequency offset/shift detector to determine a frequency offset/shift status of the current phase signal from the signal (that is, the phase adjustment signal) processed by the PLL circuit, thereby generating the frequency offset/shift determining signal. Accordingly, when the FM demodulation device learns based on the frequency offset/shift determining signal that the frequency offset/shift of the input signal is excessively large, the FM demodulation device may automatically adjust the receiving frequency band of the input signal to reduce the frequency offset/shift or automatically reduce the volume of the audio signal, so that the user may obtain good audio quality through the FM demodulation device.

What is claimed is:

1. A frequency modulation demodulation device comprising:
    an input terminal, for receiving an input signal;
    a phase converter, coupled to the input terminal, for receiving the input signal to obtain a phase signal;
    a phase-locked loop circuit, coupled to the phase converter, for generating a phase adjustment signal according to the phase signal, and adjusting the phase signal according to the phase adjustment signal to perform demodulation of the input signal; and
    a frequency shift detector, coupled to the phase-locked loop circuit, for generating a frequency shift determining signal according to the phase adjustment signal obtained from the phase-locked loop circuit, wherein the frequency shift determining signal is related to a phase frequency shift of the input signal.

2. The frequency modulation demodulation device according to claim 1, wherein the phase-locked loop circuit comprises:
    an adder, for receiving the phase signal from the phase converter and adding up the phase signal and the phase adjustment signal to generate an adjusted phase signal;
    a loop filter, coupled to the adder, for receiving and filtering the adjusted phase signal to generate a filtered phase signal; and
    a voltage-controlled oscillator, coupled to the loop filter, for generating the phase adjustment signal according to the filtered phase signal.

3. The frequency modulation demodulation device according to claim 1, wherein the frequency shift detector comprises:
    a phase zero-crossing determining circuit, for receiving the phase adjustment signal and determining an adjustment direction of the phase adjustment signal with respect to the phase signal to generate a frequency shift detection signal; and
    an accumulator, coupled to the phase zero-crossing determining circuit, for accumulating the frequency shift detection signal to generate a frequency shift accumulation signal, wherein the frequency shift accumulation signal is related to the frequency shift determining signal to present a phase frequency shift status of the input signal.

4. The frequency modulation demodulation device according to claim 3, wherein the phase zero-crossing determining circuit determines whether the phase adjustment signal is changed from a positive value to a negative value, or determines whether the phase adjustment signal is changed from a negative value to a positive value,
when the phase adjustment signal is changed from a positive value to a negative value, the phase zero-crossing determining circuit sets the frequency shift detection signal to a predetermined positive frequency shift value to indicate that the adjustment direction of the phase signal is a first adjustment direction, and
when the phase adjustment signal is changed from a negative value to a positive value, the phase zero-crossing determining circuit sets the frequency shift detection signal to a predetermined negative frequency shift value to indicate that the adjustment direction of the phase signal is a second adjustment direction, wherein the first adjustment direction is opposite to the second adjustment direction.

5. The frequency modulation demodulation device according to claim 2, wherein one of the adjusted phase signal, the filtered phase signal, and the phase adjustment signal of the phase-locked loop circuit is used as an output signal of the frequency modulation demodulation device.

6. The frequency modulation demodulation device according to claim 1, further comprising:
a frequency domain converter, coupled to the phase converter, for generating a demodulated output signal according to the phase signal.

7. The frequency modulation demodulation device according to claim 6, further comprising:
a selector, coupled to the frequency domain converter and the phase-locked loop circuit, wherein a first terminal of the selector receives the demodulated output signal generated by the frequency domain converter, and a second terminal of the selector receives a filtered phase signal generated by the phase-locked loop circuit, wherein the selector selectively uses one of the demodulated output signal and the filtered phase signal as an output signal of the frequency modulation demodulation device according to an amplitude or signal quality of the input signal.

8. The frequency modulation demodulation device according to claim 7, wherein when the amplitude or the signal quality of the input signal is greater than a predetermined energy value, the selector uses the demodulated output signal generated by the frequency domain converter as the output signal of the frequency modulation demodulation device, and
when the amplitude or the signal quality of the input signal is less than the predetermined energy value, the selector uses the filtered phase signal generated by the phase-locked loop circuit as the output signal of the frequency modulation demodulation device.

9. The frequency modulation demodulation device according to claim 1, further comprising:
a controller, coupled to the frequency shift detector, wherein
the controller adjusts a receiving frequency band of the input signal according to the frequency shift determining signal.

10. The frequency modulation demodulation device according to claim 1, further comprising:

a sound control device, coupled to the frequency shift detector, wherein
the sound control device adjusts a magnitude of a sound wave of an audio signal according to the frequency shift determining signal, and the audio signal is related to the demodulated input signal.

11. A control method of a frequency modulation demodulation device, comprising:
receiving an input signal;
obtaining, by a phase converter, a phase signal according to the input signal;
generating, by a phase-locked loop circuit, a phase adjustment signal according to the phase signal, wherein the phase-locked loop circuit adjusts the phase signal according to the phase adjustment signal to perform demodulation of the input signal; and
generating a frequency shift determining signal according to the phase adjustment signal, wherein the frequency shift determining signal is related to a phase frequency shift of the input signal.

12. The control method according to claim 11, wherein the step of generating the frequency shift determining signal comprises:
determining an adjustment direction of the phase adjustment signal with respect to the phase signal to generate a frequency shift detection signal; and
accumulating the frequency shift detection signal to generate a frequency shift accumulation signal, wherein the frequency shift accumulation signal is related to the frequency shift determining signal and is used to present a phase frequency shift status of the input signal.

13. The control method according to claim 12, wherein the step of determining the adjustment direction of the phase adjustment signal with respect to the phase signal to generate the frequency shift detection signal comprises:
determining whether the phase adjustment signal is changed from a positive value to a negative value, or determining whether the phase adjustment signal is changed from a negative value to a positive value,
when the phase adjustment signal is changed from a positive value to a negative value, setting the frequency shift detection signal to a predetermined positive frequency shift value to indicate that the adjustment direction of the phase signal is a first adjustment direction; and
when the phase adjustment signal is changed from a negative value to a positive value, setting the frequency shift detection signal to a predetermined negative frequency shift value to indicate that the adjustment direction of the phase signal is a second adjustment direction, wherein the first adjustment direction is opposite to the second adjustment direction.

14. The control method according to claim 11, further comprising:
generating, by a frequency domain converter, a demodulated output signal according to the phase signal;
selectively using one of the demodulated output signal and a filtered phase signal generated by the phase-locked loop circuit as an output signal of the frequency modulation demodulation device according to an amplitude or signal quality of the input signal;
when the amplitude or the signal quality of the input signal is greater than a predetermined energy value, using the demodulated output signal generated by the frequency domain converter as the output signal of the frequency modulation demodulation device; and when the amplitude or the signal quality of the input signal is less than the predetermined energy value, using the filtered phase signal generated by the phase-locked loop circuit as the output signal of the frequency modulation demodulation device.

15. The control method according to claim 11, further comprising:
adjusting a receiving frequency band of the input signal according to the frequency shift determining signal.

16. The control method according to claim 11, further comprising:
adjusting a magnitude of a sound wave of an audio signal according to the frequency shift determining signal, wherein the audio signal is related to the demodulated input signal.

* * * * *